(12) United States Patent
Dahlstrom et al.

(10) Patent No.: US 7,696,604 B2
(45) Date of Patent: Apr. 13, 2010

(54) SILICON GERMANIUM HETEROSTRUCTURE BARRIER VARACTOR

(75) Inventors: Erik M. Dahlstrom, Burlington, VT (US); Alvin J. Joseph, Williston, VT (US); Robert M. Rassel, Colchester, VT (US); David C. Sheridan, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 98 days.

(21) Appl. No.: 11/876,787

(22) Filed: Oct. 23, 2007

(65) Prior Publication Data

US 2009/0101887 A1    Apr. 23, 2009

(51) Int. Cl.
*H01L 29/93* (2006.01)
*H01L 27/108* (2006.01)
*H01L 29/76* (2006.01)
*H01L 29/94* (2006.01)
*H01L 31/119* (2006.01)

(52) U.S. Cl. .................. 257/595; 257/312; 257/480; 257/596; 257/597; 257/598; 257/599; 257/600; 257/601; 257/602; 257/E27.049; 257/E29.344

(58) Field of Classification Search .................. 257/312, 257/480, 595–602, E27.049, E29.344
See application file for complete search history.

(56) References Cited

U.S. PATENT DOCUMENTS

| | | | | |
|---|---|---|---|---|
| 3,864,819 A * | 2/1975 | Ying | ................... | 438/113 |
| 5,278,444 A * | 1/1994 | Lieneweg et al. | ........... | 257/476 |
| 5,336,923 A * | 8/1994 | Geddes et al. | .............. | 257/596 |
| 5,747,865 A * | 5/1998 | Kim et al. | .................... | 257/480 |
| 5,789,801 A * | 8/1998 | Stoneham | .................... | 257/597 |
| 6,008,506 A * | 12/1999 | Morikawa | .................... | 257/85 |
| 6,154,475 A * | 11/2000 | Soref et al. | ............ | 372/45.011 |
| 6,331,716 B1 * | 12/2001 | Kano | ........................... | 257/14 |
| 6,673,265 B1 | 1/2004 | Nguyen | | |
| 6,787,882 B2 * | 9/2004 | Kirchoefer | .................. | 257/596 |
| 6,933,796 B2 * | 8/2005 | Suzuki et al. | ........... | 331/177 V |
| 7,023,038 B2 * | 4/2006 | Jong | .......................... | 257/296 |
| 7,180,648 B2 * | 2/2007 | Dohrman et al. | ............ | 359/248 |
| 7,385,241 B2 * | 6/2008 | Choi | .......................... | 257/307 |
| 7,457,487 B2 * | 11/2008 | Miller et al. | .................... | 385/2 |
| 7,518,215 B2 * | 4/2009 | Coolbaugh et al. | .......... | 257/595 |
| 7,518,850 B2 * | 4/2009 | Kim et al. | .................... | 361/328 |
| 2002/0180003 A1 * | 12/2002 | Nakano | ....................... | 257/597 |
| 2003/0052388 A1 | 3/2003 | Mheen et al. | | |
| 2003/0146484 A1 | 8/2003 | Voldman | | |
| 2004/0211998 A1 * | 10/2004 | Araujo et al. | ............... | 257/295 |
| 2006/0076625 A1 * | 4/2006 | Lee et al. | .................... | 257/353 |
| 2006/0243963 A1 * | 11/2006 | Kreps et al. | .................... | 257/28 |

\* cited by examiner

*Primary Examiner*—Ida M Soward
(74) *Attorney, Agent, or Firm*—DeLio & Peterson, LLC; Kelly M. Nowak; Anthony Canale

(57) ABSTRACT

Methods and heterostructure barrier varactor (HBV) diodes optimized for application with frequency multipliers at providing outputs at submillimeter wave frequencies and above. The HBV diodes include a silicon-containing substrate, an electrode over the silicon-containing substrate, and one or more heterojunction quantum wells of alternating layers of Si and SiGe of one or more electrodes of the diode. Each SiGe quantum well preferably has a floating SiGe layer between adjacent SiGe gradients followed by adjacent Si layers, such that, a single homogeneous structure is provided characterized by having no distinct separations. The plurality of Si/SiGe heterojunction quantum wells may be symmetric or asymmetric.

18 Claims, 7 Drawing Sheets

SILICON GERMANIUM HETEROSTRUCTURE BARRIER VARACTOR

FIELD OF THE INVENTION

The present invention relates to semiconductors devices and, more particularly, to semiconductor heterostructure barrier (HBV) diodes.

DESCRIPTION OF RELATED ART

Semiconductor devices known as varactor diodes are characterized as having a capacitance that varies as a variable bias voltage is applied to a depletion region of the diode. That is, as a reverse voltage is applied to a PN junction of the varactor diode, electrons in the n-region are attracted to the cathode while holes in the p-region are attracted to the anode. The result is a depletion region between the anode and cathode that behaves as the dielectric of the device. As the applied reverse voltage increases, the depletion region (i.e., dielectric) widens, while the capacitance across the PN junction decreases since capacitance is inversely proportional to dielectric thickness. Therefore, by varying the reverse voltage across a PN junction of a varactor diode, the junction capacitance can be varied.

Due to their variable capacitances, varactor diodes are used in a number of different semiconductor applications including, for example, frequency multipliers, harmonic generators, oscillators and phase shifters, etc. Conventional varactor diodes include both P-N junction diodes and Schottky diodes. Schottky diodes include layers that are doped with impurities in order to achieve a desired variable capacitance, and are often used as frequency multipliers for converting a low baseband signal to higher output frequencies. However, Schottky diodes unfortunately create harmonics at both even and odd frequencies, thereby reducing the overall efficiency of this type of multiplier circuit.

Conventional P-N junction diodes and Schottky diodes are also plagued by the presence of leakage current, which lowers the quality of the diode. Another type of variable-capacitance devices is barrier varactor diodes, which minimize this leakage current.

A barrier varactor includes the careful choice of materials and thicknesses to optimize the effectiveness of the barrier therein. For instance, known barrier varactors include heterostructure varactors formed on GaAs substrates using a variety of semiconductor materials, typically resulting in AlGaAs stacks that create a barrier to current flow and act as voltage dependent capacitors. An advantage of heterostructure varactors is that they can be created with symmetric CV characteristics and very low current flow. As such, the use of heterostructure barrier varactors, instead of Schottky diodes, in millimeter wave circuits can eliminate the even harmonics, as well as reduce the need for DC bias and additional idler current sources, thereby enabling a higher efficiency converter. However, the use of heterostructure varactors is limited in its chemistry, and has yet to be easily and efficiently extended into silicon technology.

Accordingly, a need exists in the art for improved methods and heterostructure barrier varactors suitable for use in silicon technology.

SUMMARY OF THE INVENTION

Bearing in mind the problems and deficiencies of the prior art, it is therefore an object of the present invention to provide easy and efficient methods of making barrier varactors in silicon technology and the resultant barrier varactors made thereby.

It is another object of the present invention to provide methods and heterostructure barrier varactors (HBV) on a silicon-containing substrate comprising a plurality of quantum wells.

A further object of the invention is to provide methods and heterostructure barrier varactors integrated into silicon-based technology to enable silicon monolithic microwave integrated circuits having improved performance.

Still other objects and advantages of the invention will in part be obvious and will in part be apparent from the specification.

The above and other objects, which will be apparent to those skilled in the art, are achieved in the present invention, which is directed to a heterostructure barrier varactor (HBV) diode that includes a silicon-containing substrate, an electrode over the silicon-containing substrate, and at least one heterojunction quantum well of alternating layers of Si and SiGe of the electrode. The silicon-containing substrate may be a silicon substrate, and the layers of Si and SiGe are preferably epitaxially grown with an n-type material or a p-type material.

In the aspect, the HBV diode may further include a plurality of heterojunction quantum wells of alternating layers of Si and SiGe. The SiGe layer may be a floating SiGe layer between adjacent SiGe gradients followed by adjacent Si layers. As such, the diode is a single homogeneous structure characterized by having no distinct separations between the floating SiGe layer, SiGe gradients and Si layers. Optionally, the diode may include a plurality of these heterojunction quantum wells, each having a corresponding floating SiGe layer.

The electrode may be an anode or a cathode, or optionally, the diode may have alternating layers of Si and SiGe of both the anode and cathode. In so doing, the heterojunction quantum wells of the anode and cathode may be symmetric, or alternatively, asymmetric. The HBV diode is preferably optimized for application with frequency multipliers at providing outputs at submillimeter wave frequencies and above.

The HBV diode of the invention may further include a spacer layer between the Si and SiGe layers. In this aspect, the SiGe layer may be a floating SiGe layer having SiGe gradients adjacent Si layers, or alternatively, it may have a substantially constant Ge concentration.

In another aspect, the invention is directed to a HBV diode that includes a silicon layer, an anode and cathode over the silicon layer, and a plurality of heterojunction quantum wells of one or more of the anode or the cathode comprising alternating layers of Si and SiGe. Both the anode and the cathode may each have at least one heterojunction quantum wells of the alternating layers of Si and SiGe, or a plurality of these alternating layers. The layers of SiGe may be floating SiGe layers residing between adjacent SiGe gradients, followed by adjacent Si layers, whereby these layers are characterized by having no distinct separations between the layers, as well as between the plurality of heterojunction quantum wells made thereby.

In still another aspect, the invention is directed to a method of fabricating a HBV diode. The method includes providing a silicon-containing substrate, exposing portions of such silicon-containing substrate, and forming at least one heterojunction quantum well. The heterojunction quantum well is formed by epitaxially growing the exposed portions of the silicon-containing substrate to provide a Si layer of desired thickness, and then doping the epitaxial growth process with Ge to provide a SiGe quantum well layer. The SiGe layer is grown or deposited to a sufficient or desired thickness suitable of the desired end-product, and then the Ge dopant concentration is vamped down to provide another Si layer. The combination of these layers provides a heterojunction quantum well for an electrode (e.g., anode or cathode). Optionally, a plurality of these layers may be formed for one or more electrodes of the diode.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
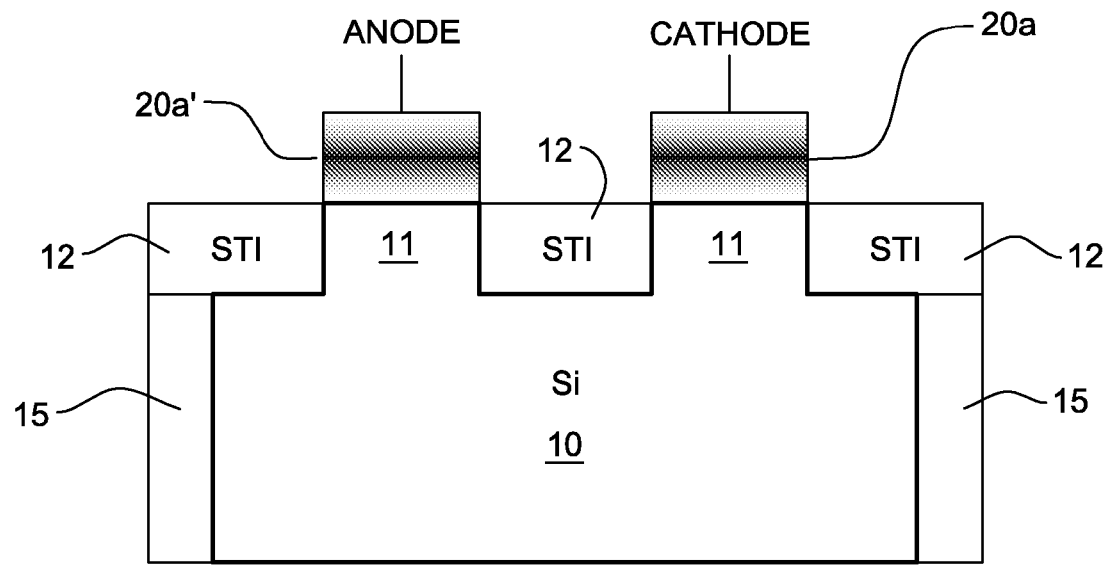
FIGS. 1A and 1B show cross sectional views of one embodiment of a silicon germanium heterostructure barrier varactor (HBV) in accordance with the present invention.

In describing the preferred embodiment of the present invention, reference will be made herein to FIGS. 1A-6B of the drawings in which like numerals refer to like features of the invention.

The present invention is directed to novel heterostructure barrier varactor (HBV) diodes on silicon-containing substrates that provide silicon monolithic microwave integrated circuits with significantly improved performance. The present HBV diodes are silicon/silicon germanium (Si/SiGe) quantum well HBVs suitable for use as frequency multipliers at submillimeter wave frequencies and above.

Referring to the drawings, a silicon or silicon-containing layer or substrate 10 (hereinafter referred to as silicon layer 10) is provided over a semiconductor substrate 5. The silicon layer 10 may be a p-type material or an n-type material. Shallow trench isolation regions (STI) 12, such as STI oxide regions, are formed by known techniques to isolate adjacent p-type silicon regions 11 from one another. Deep trench isolations 15 isolate active regions of the device from non-active regions.

Figure 1B:
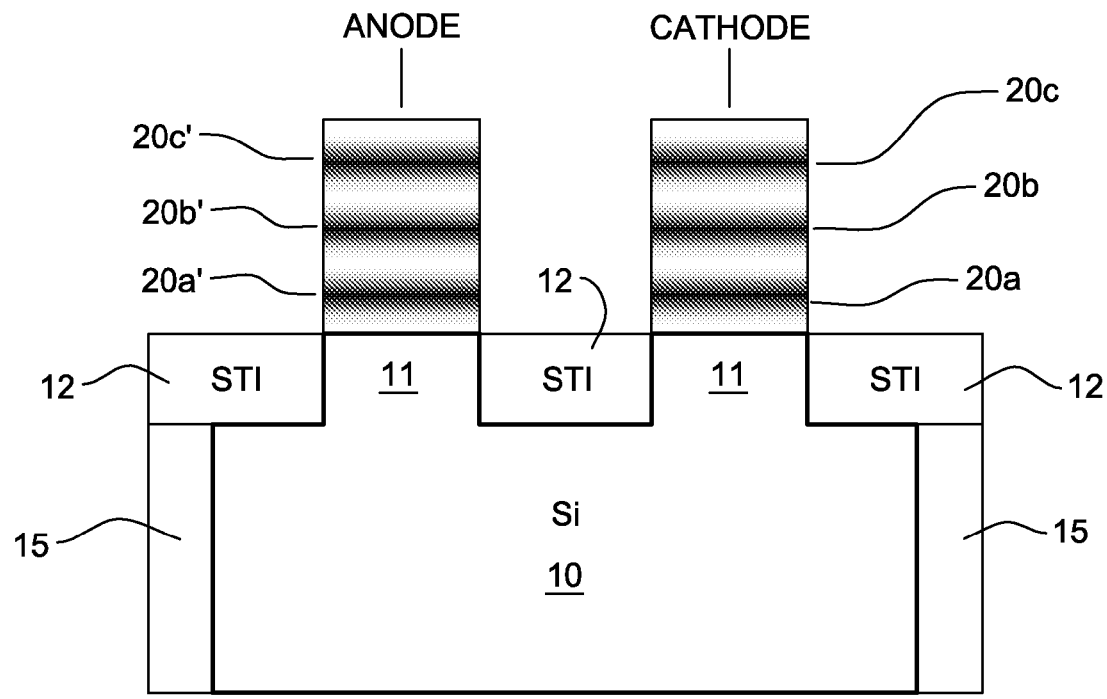

In accordance with the invention, FIGS. 1A and 1B show the present Si/SiGe quantum well HBVs are formed over p-type silicon regions 11. In so doing, the Si/SiGe quantum wells are formed by epitaxial growth using known processing equipment such as, for instance, by low-temperature epitaxy (LTE). The present HBV has one or more SiGe quantum well layers isolated by adjacent barrier layers of Si.

In one embodiment of the invention, the wells are provided by epitaxially growing the p-type silicon region 11 for a desired time or thickness to provide a silicon barrier region. Once a barrier is formed, a sufficient amount of Ge dopant is added to the growth process to form the SiGe quantum well layer. The Ge is gradually added until a desired concentration of Ge is obtained, such that, during the growth process a SiGe gradient is formed between the Si barrier and the SiGe quantum well layer. Once this SiGe quantum well layer is formed to a desired thickness, the doping concentration of Ge is then vamped down to provide another SiGe gradient followed by pure Si growth to provide another silicon barrier region. It should be appreciated and understood that the Ge concentration may be varied during the quantum well formation to provide SiGe quantum well layers for both profile and device optimization. Preferably, the SiGe quantum well layer is doped with at least 25% Ge, or more.

As shown in FIG. 1A, the resultant HBV comprises a Si/SiGe quantum well 20a, 20a' that is a single homogeneous structure having a configuration characterized by having no distinct separation between the Si barriers and the SiGe quantum well layer. That is, the SiGe well layer comprises a floating SiGe well layer isolated by adjacent Si layers (i.e., it is junction isolated).

Referring to FIG. 1B, in order to enhance barrier affects, manipulate the band gaps and enable higher operating powers, a plurality of the present SiGe quantum wells 20a, 20a', 20b, 20b', 20c, 20c' layers may be provided to form a single homogeneous HBV with symmetric capacitance-voltage characteristics. In so doing, each SiGe well layer is isolated by Si barrier layers. During the formation of a multi-heterojunction varactor diode of the invention having alternating SiGe well layers, the dopant concentration of Ge is vamped up and down during the epitaxial growth process to provide the HBV with more than one SiGe well layer. Preferably, the multi-heterojunction HBV may be provided with up to five SiGe isolated well layers. While more than five SiGe quantum well layers may be implemented, it should be appreciated that too many SiGe layers would undesirably affect the harmonics of the diode.

In the present multi-heterojunction HBV, each SiGe well layer is junction isolated from one another by SiGe gradients and Si barrier layers on opposing sides thereof. Again, the resultant HBV diode of FIG. 1B is a single homogeneous structure characterized by having no distinct separations between the various layers within the multi-heterojunction HBV (i.e., there is no separation between the layers of Si barrier to SiGe gradient to SiGe well layer to SiGe gradient to Si barrier). In so doing, the invention advantageously provides a solution to what has heretofore been a multi-heterojunction semiconductor varactor diode implementation of Groups III-V semiconductor substrates (e.g., GaAs).

In accordance with the invention, the homogenous Si/SiGe layers may be formed as part of one or more electrodes of the varactor. That is, the Si/SiGe layers may be formed as single varactor diode structures for either an anode or cathode of the HBV diode (FIG. 3A), or they may be formed as double varactor diode structures for both the anode and cathode electrodes (FIG. 3B). As such, two symmetrical (i.e., identical) electrodes may be formed with the same layers and same dopant type, or two asymmetric (i.e., different) electrodes can be formed in the anode and cathode regions. These two asymmetric electrodes may have different varactor profiles including, but not limited to, different thicknesses of the SiGe layers, different dopants of the SiGe layers (e.g., one n-type and one p-type, or different dopant concentrations), or even one being a heterostructure varactor and one being a non-heterostructure.

Figure 3A:
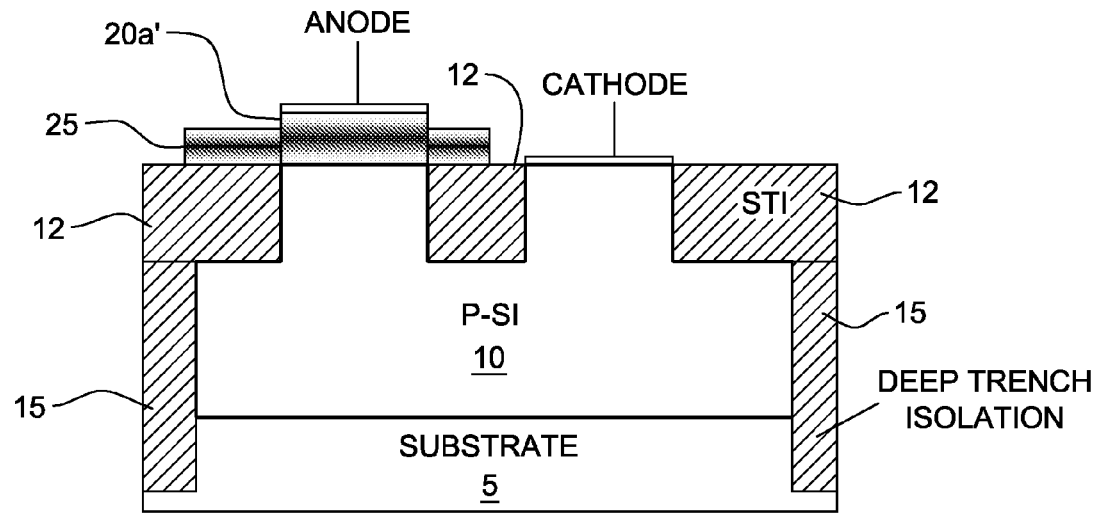
FIG. 3A is another cross sectional view showing a single HBV in accordance with the embodiment of FIGS. 1A and 1B.
Figure 3B:
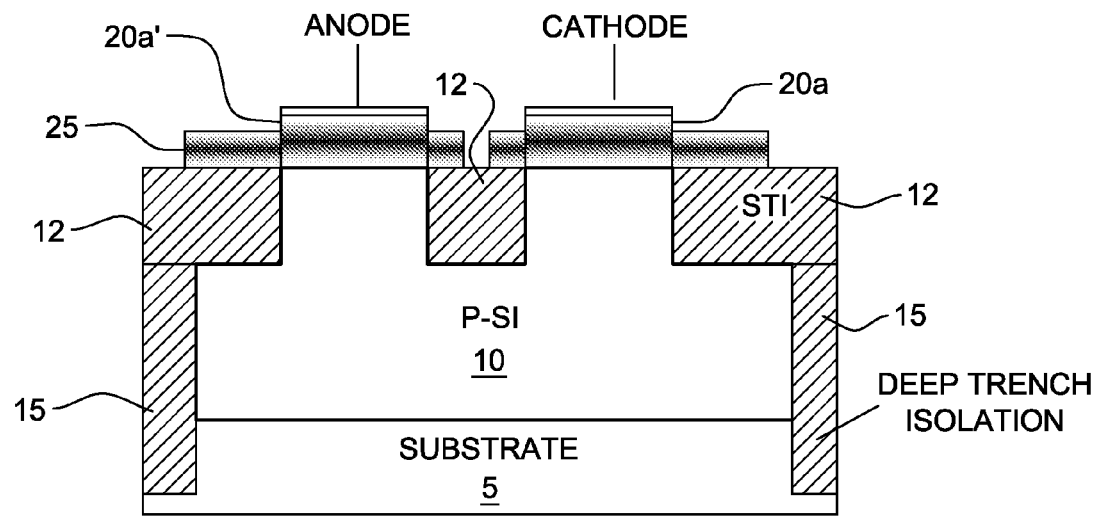
FIG. 3B is yet another cross sectional view showing double HBVs in accordance with the embodiment of FIGS. 1A and 1B.

Referring to FIGS. 3A and 3B, during the low-temperature epitaxy (LTE) growth process, as crystalline Si/SiGe layers are grown over exposed active silicon regions 11, amorphous polysilicon/SiGe layers are also formed over STI regions. The LTE growth will typically be thicker over the single crystalline exposed silicon, as compared to over STI regions, since it takes longer for the LTE growth to nucleate over the STI regions. The present HBV structures are self-aligned as formed since the crystalline heterostructure quantum wells are formed only over the exposed active silicon regions 11.

Figure 2A:
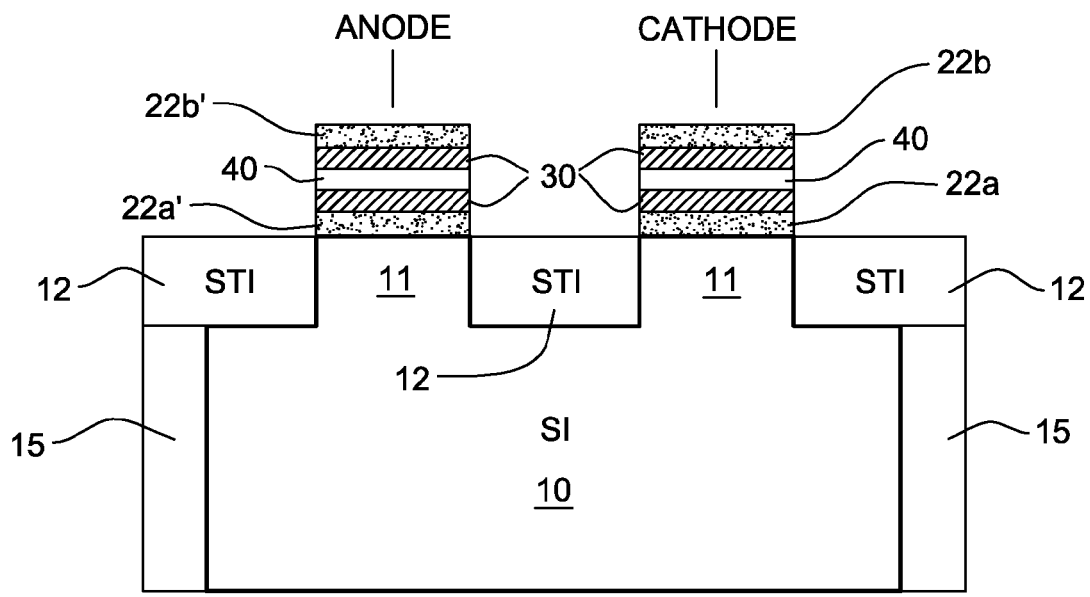
FIGS. 2A-D show cross sectional views of other embodiments of SiGe HBVs in accordance with the invention.
Figure 2B:
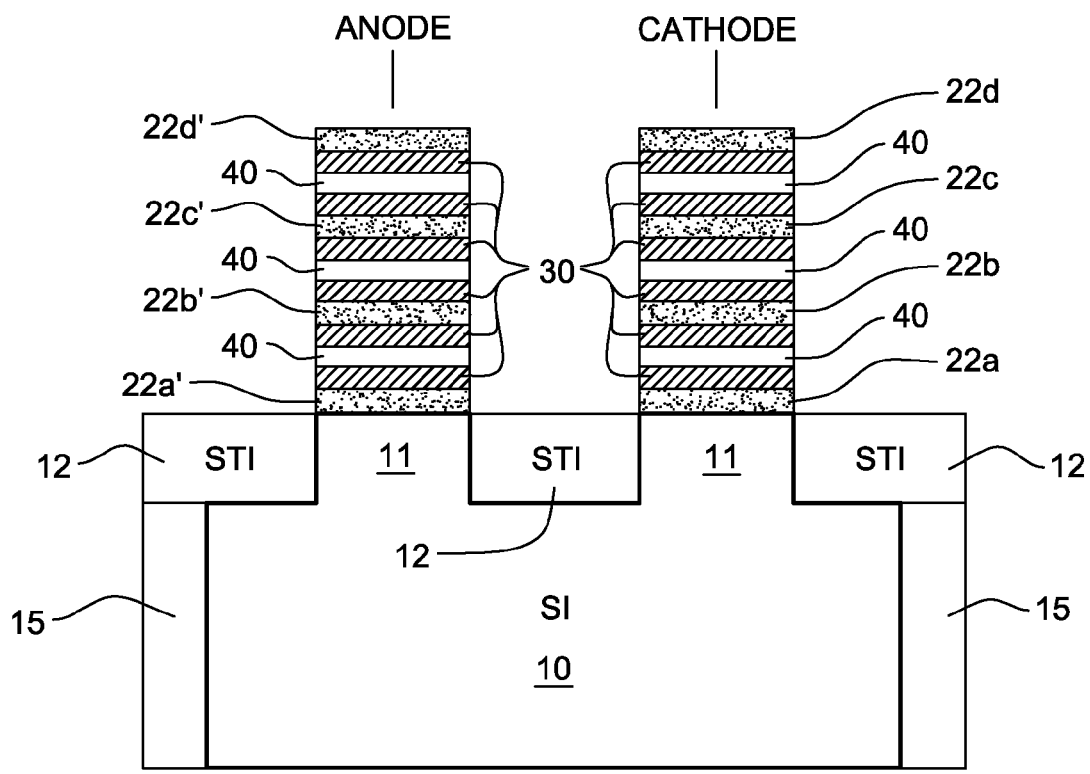
Figure 2C:
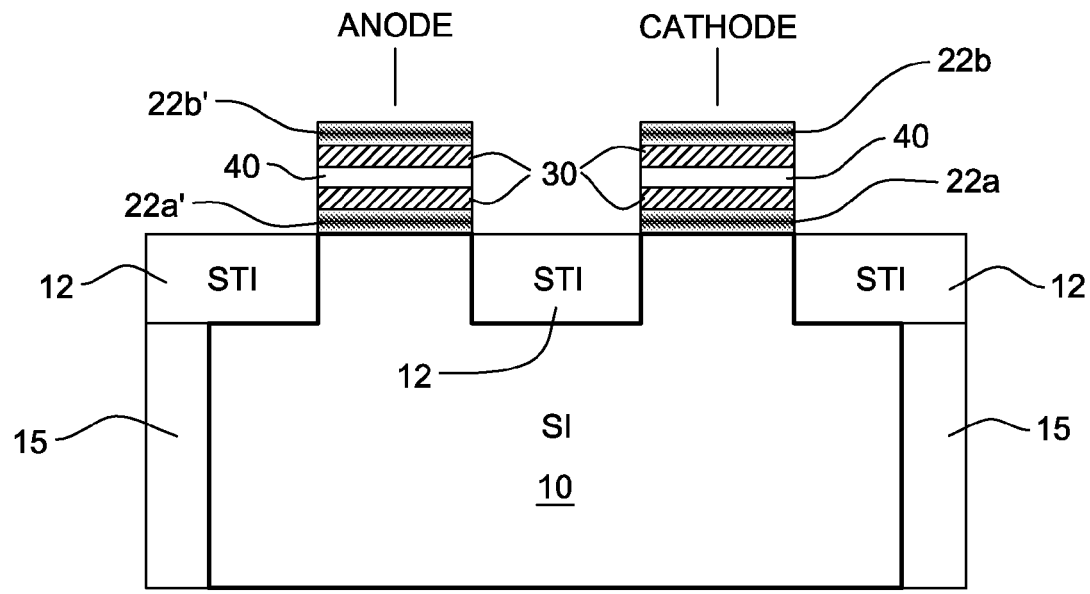
Figure 2D:
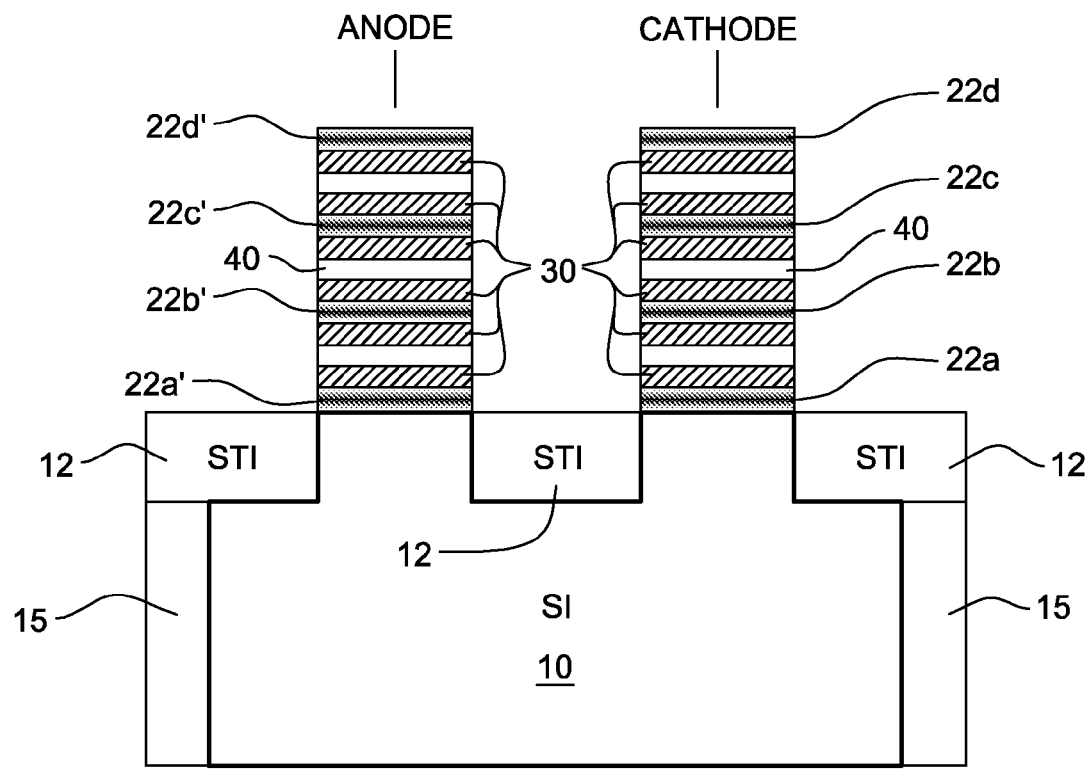

As an alternative embodiment, the various layers of the present SiGe HBV diodes may have distinct separations. Referring to FIGS. 2A-2D, the SiGe quantum well layers are provided over active silicon regions 11 by epitaxy growth. In so doing, these SiGe quantum well layers may be a continuous layer of SiGe 22a, 22a', 22b, 22b', 22c, 22c', etc. having a consistent concentration of Ge dopant throughout (FIGS. 2A and 2B), or the SiGe quantum well layers may be Si/SiGe quantum wells 20a, 20a', 20b, 20b', 20c, 20c' etc. of Si/SiGe of Si barrier to SiGe gradient to SiGe layer to SiGe gradient to Si barrier (FIGS. 2C and 2D). It should be appreciated and understood that the present invention is not to be limited to the foregoing SiGe quantum well layers, but also includes variations of these SiGe quantum well layers as will be apparent to those skilled in the art in light of the foregoing description.

A spacer layer 30 is then formed over the SiGe quantum well layer 20a, 20a, followed by a Si barrier layer 40, another spacer layer 30 and then another SiGe quantum well layer 20b, b'. In so doing, the spacer layers 30 are preferably formed by breaking the LTE vacuum and moving the device to another processing chamber. The spacer layers are deposited to a thickness sufficient for device optimization, and may comprise an oxide layer including, but not limited to, a $SiO_2$ layer. In forming the Si layers 40, the device is moved back into the LTE processing chamber and the Si barriers 40 also formed to a sufficient thickness for a desired device optimization. These layers may be repeated as shown in FIG. 2D to enhance the barrier and enable higher operating powers. The HBVs may also be formed as a single varactor.

Figure 4:
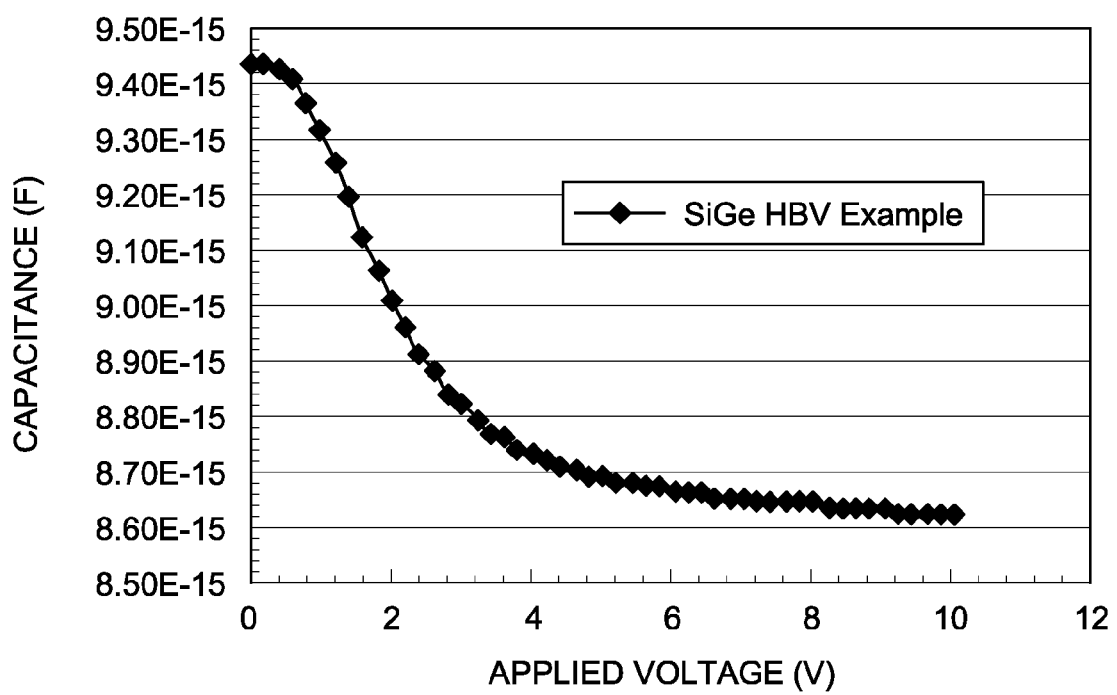
FIG. 4 is a graphical representation of a C-V profile of an HBV in accordance with the present invention.

In accordance with the invention, the symmetric shapes of the active silicon regions 11 enable symmetric LTE growth to form the present varactors for both the anode and cathode. P+ contact implants can then be formed at both the anode and cathode to reduce contact resistivity before silicide and CA contact formation. FIGS. 4 and 6B show examples of capacitance-voltage (C-V) profiles of SiGe HBV diodes in accordance with the invention. The present SiGe HBV diodes have symmetric C-V profiles with high C-V tuning ranges to provide more efficient multipliers, particularly more efficient multipliers at high frequencies.

Figure 5A:
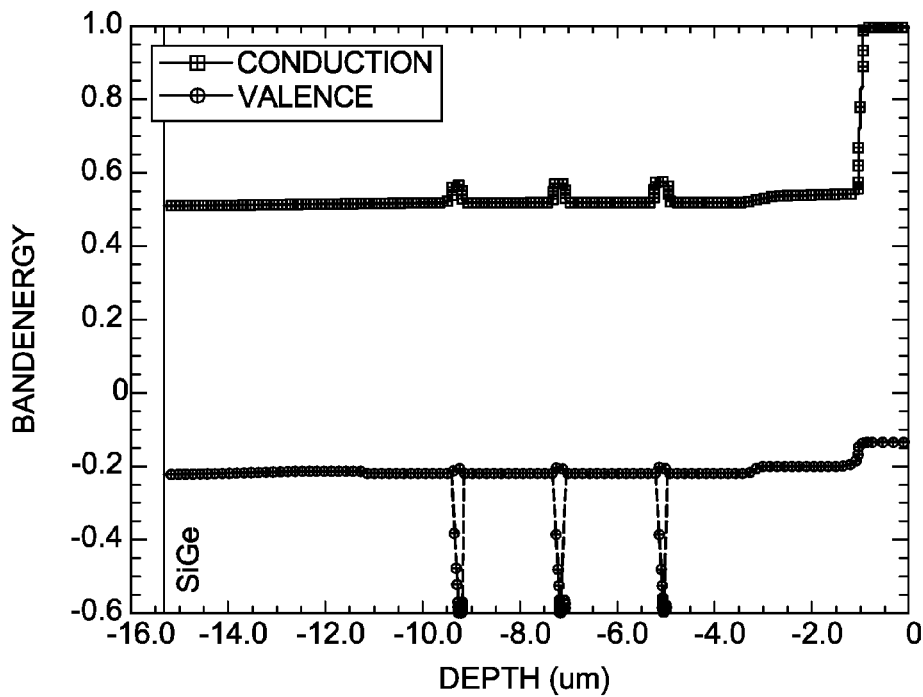
FIGS. 5A and 5B show conduction and valence band diagrams of a Si/SiGe HBV of the invention.
Figure 5B:
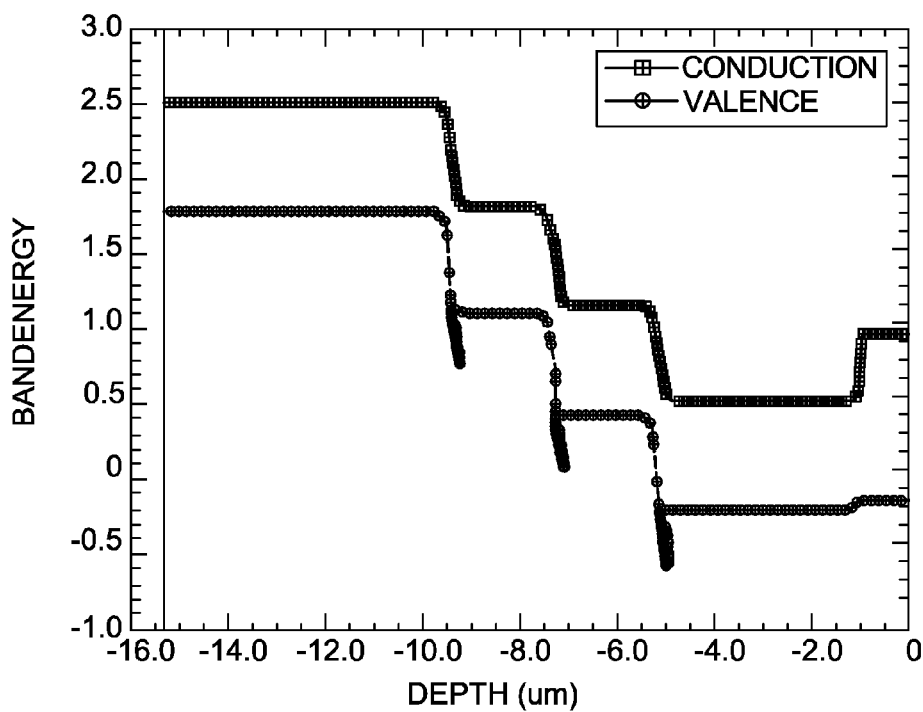
Figure 6A:
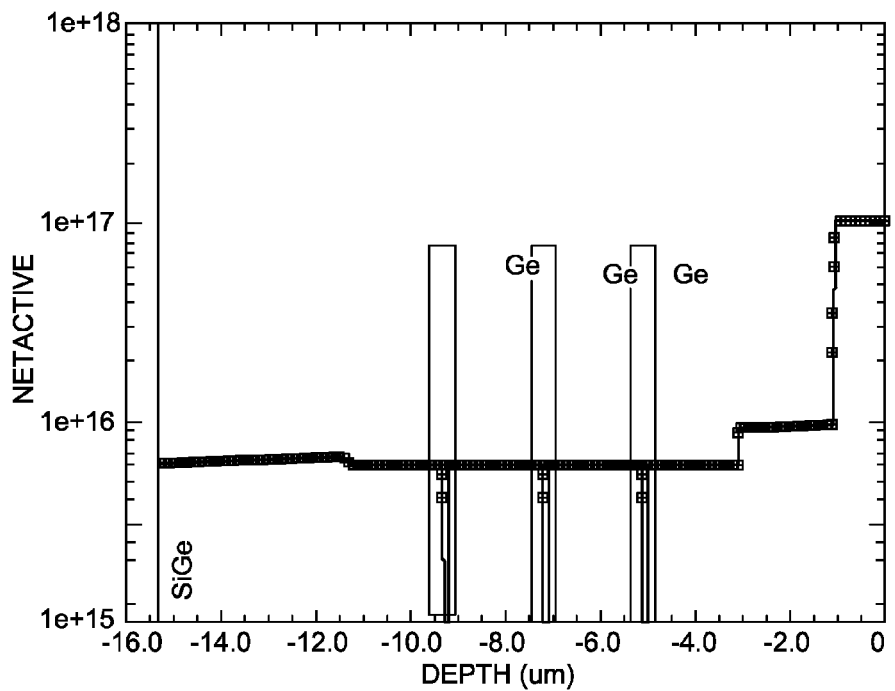
FIG. 6A shows the netActive diagram of a single polarity HBV in accordance with the invention.
Figure 6B:
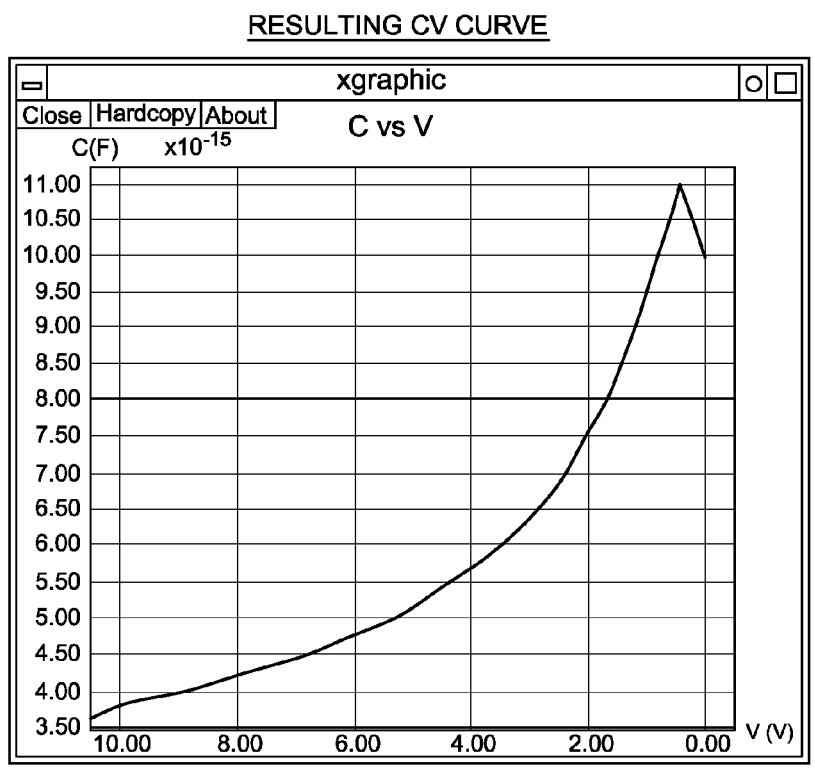
FIG. 6B is another graphical representation of a C-V profile of the present Si/SiGe HBV.

FIGS. 5A and 5B show the conduction band diagram of a SiGe HBV of the invention respectively at 0V bias and about 2V bias, while FIG. 6A shows the netActive dopant concentration diagram of a single polarity HBV having 3 SiGe quantum well layers (e.g., SiGe layer at about 9 microns, SiGe layer at about 7 microns, and SiGe layer at about 5 microns). As shown by these diagrams, the hole confinement areas of the present SiGe HBVs are maintained through a reasonable bias.

Again, the SiGe HBV diodes of the invention advantageously provide a silicon technology solution to what has heretofore been single-heterojunction or multi-heterojunction semiconductor varactor diode implementation of Groups III-V. The present SiGeHBV diodes also advantageously have symmetric C-V profiles, enhanced capacitance ratios and minimal leakage current, thereby maximizing the overall efficiency of the device. The SiGe quantum wells enable integration of the present HBV into an integrated Si technology to enable silicon monolithic microwave integrated circuits having improved performance. For example, the invention may be fully integrated into BiCMOS processing and technology. Also, the epitaxy growth of the active silicon regions into floating heterojunction SiGe well layers, or heterojunction SiGe well layers, avoids sidewall passivation as well as mesa isolation problems associated with conventional GaAs heterojunction devices.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A heterostructure barrier varactor (HBV) diode comprising:
   a silicon-containing substrate;
   an electrode over said silicon-containing substrate; and
   at least one heterojunction quantum well of alternating layers of Si and SiGe of said electrode, said layer of said SiGe comprises a floating SiGe layer between adjacent SiGe gradients followed by adjacent Si layers.

2. The HBV diode of claim 1 wherein said silicon-containing substrate comprises a silicon substrate.

3. The HBV diode of claim 1 wherein said layers of Si and SiGe are epitaxially grown with an n-type material or a p-type material.

4. The HBV diode of claim 1 further including a plurality of heterojunction quantum wells of alternating layers of Si and SiGe.

5. The HBV diode of claim 1 wherein said electrode comprises an anode.

6. The HBV diode of claim 1 wherein said electrode comprises a cathode.

7. The HBV diode of claim 1 wherein said HBV diode is optimized for application with frequency multipliers at providing outputs at submillimeter wave frequencies and above.

8. The HBV diode of claim 1 wherein said HBV diode comprises a single homogeneous structure characterized by having no distinct separations between floating SiGe layer, said SiGe gradients and said Si layers.

9. The HBV diode of claim 8 further including a plurality of heterojunction quantum wells, each having a corresponding said floating SiGe layers.

10. The HBV diode of claim 1 further including said HBV diode having heterojunction quantum wells of alternating layers of Si and SiGe of both an anode and a cathode.

11. The HBV diode of claim 10 wherein said heterojunction quantum wells of said anode and said cathode are symmetric.

12. The HBV diode of claim 10 wherein said heterojunction quantum wells of said anode and said cathode are asymmetric.

13. A heterostructure barrier varactor (HBV) diode comprising:
   a silicon-containing substrate;
   an electrode over said silicon-containing substrate;
   at least one heterojunction quantum well of alternating layers of Si and SiGe of said electrode; and
   a spacer layer between said Si layer and said SiGe layer.

14. The HBV diode of claim 13 wherein said SiGe layer comprises a floating SiGe layer having SiGe gradients adjacent Si layers.

15. The HBV diode of claim 13 wherein said SiGe layer has a substantially constant Ge concentration.

16. A heterostructure barrier varactor (HBV) diode comprising:
- a silicon layer;
- an anode and a cathode over said silicon layer; and
- a plurality of heterojunction quantum wells of one or more of said anode or said cathode comprising alternating layers of Si and SiGe.

17. The HBV diode of claim 16 wherein both said anode and said cathode each have at least one heterojunction quantum well of said alternating layers of Si and SiGe.

18. The HBV diode of claim 16 wherein said layers of SiGe comprise floating SiGe layers residing between adjacent SiGe gradients followed by adjacent Si layers characterized by having no distinct separations within said plurality of heterojunction quantum wells.

\* \* \* \* \*

UNITED STATES PATENT AND TRADEMARK OFFICE
CERTIFICATE OF CORRECTION

PATENT NO. : 7,696,604 B2
APPLICATION NO. : 11/876787
DATED : April 13, 2010
INVENTOR(S) : Erik M. Dahlstrom et al.

Page 1 of 1

It is certified that error appears in the above-identified patent and that said Letters Patent is hereby corrected as shown below:

Col. 1, line 2,

Please add the following paragraph after the title in the specification:

--This invention was made with Government support under Contract No.: N66001-02-C-8014 awarded by Defense Advanced Research Projects Agency (DARPA). The Government has certain rights in this invention.--.

Signed and Sealed this
Sixteenth Day of April, 2013

Teresa Stanek Rea
*Acting Director of the United States Patent and Trademark Office*